United States Patent
Choi et al.

(10) Patent No.: US 7,822,404 B2
(45) Date of Patent: Oct. 26, 2010

(54) DRIVING VOLTAGE CONTROL MODULE

(75) Inventors: Byoung Gun Choi, Daegu (KR); Seong-Su Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1157 days.

(21) Appl. No.: 11/474,552

(22) Filed: Jun. 26, 2006

(65) Prior Publication Data

US 2007/0093220 A1    Apr. 26, 2007

(30) Foreign Application Priority Data

Oct. 24, 2005    (KR) .................... 10-2005-0100343

(51) Int. Cl.
*H04B 1/16* (2006.01)

(52) U.S. Cl. .............. 455/343.1; 455/127.5; 455/343.5; 455/574

(58) Field of Classification Search ............ 455/343.1, 455/343.2, 343.5, 550.1, 556.1, 572, 574, 455/575.1, 90.3, 127.1, 127.5, 67.11, 573, 455/343.6

See application file for complete search history.

(56) References Cited

U.S. PATENT DOCUMENTS

| | | | |
|---|---|---|---|
| 5,140,698 A | | 8/1992 | Toko |
| 6,385,470 B1 * | | 5/2002 | Bendixen .................. 455/574 |
| 6,400,207 B1 | | 6/2002 | Ivanov et al. |
| 6,757,526 B1 | | 6/2004 | Sharp et al. |
| 7,522,941 B2 * | | 4/2009 | Lu .............................. 455/574 |
| 2004/0178885 A1 | | 9/2004 | Denison et al. |
| 2005/0064829 A1 | | 3/2005 | Kang et al. |

FOREIGN PATENT DOCUMENTS

| | | |
|---|---|---|
| JP | 2001-28545 | 1/2001 |
| JP | 2001-169003 | 6/2001 |
| KR | 10-0346503 | 9/1997 |
| KR | 10-0307563 | 8/2001 |
| KR | 10-0326310 | 1/2002 |

* cited by examiner

*Primary Examiner*—Pablo N Tran
(74) *Attorney, Agent, or Firm*—Ladas & Parry LLP

(57) ABSTRACT

Provided is a driving voltage control module capable of minimizing current consumption and time taken to return from a standby state to a normal state by controlling driving voltages for electronic circuits and systems for communication when a mobile communication transceiving circuit or a communication system is in a standby state in which there is no busy signal. The driving voltage control module includes a regulator for converting an input power voltage into a predetermined level of DC voltage, and supplying the converted DC voltage to an external circuit module as a driving voltage; and a voltage controller for controlling an output voltage level of the regulator, wherein, under control of the voltage controller, a level of the driving voltage is adjusted to be a standby voltage level lower than a turn-on voltage level of a switching device constituting the external circuit module. With the driving voltage control module, the transceiving circuit and the RF circuit of the RF mobile communication terminal can be supplied with distinct power voltages each corresponding to the cut-off state, the standby state, and the normal operation state, thereby reducing current consumption and the time taken to reach the normal state from the standby state. This can increase the battery lifetime and embody a high-speed RF mobile communication terminal.

5 Claims, 4 Drawing Sheets

DRIVING VOLTAGE CONTROL MODULE

CROSS-REFERENCE TO RELATED APPLICATION

This application claims priority to and the benefit of Korean Patent Application No. 2005-100343, filed Oct. 24, 2005, the disclosure of which is incorporated herein by reference in its entirety.

BACKGROUND

1. Field of the Invention

The present invention relates to a power control module for preventing power waste in a standby state of a power consuming device such as a radio frequency amplifier. More particularly, the present invention relates to a driving voltage control module capable of minimizing current consumption and time taken to return from a standby state to a normal state by controlling power voltages (driving voltages) for electronic circuits and systems for communication when a mobile communication transceiving circuit or a communication system is in a standby state in which there is no busy signal.

2. Discussion of Related Art

In general, when electronic circuits and systems for a mobile communication terminal (e.g., portable phone) are in a standby state, power voltages supplied to constituent elements are cut off to reduce power consumption. When the power voltage is again supplied in a cut-off state, some time is taken to reach a normal state due to presence of capacitance within the electronic circuit. The capacitance is included in all unit elements constituting the electronic circuits. Time taken to charge the capacitance until the normal operation state becomes decreases response speed. As the electronic circuits and systems get complex, such a time gets longer. In addition, it is difficult to achieve high response speed and high data rate.

Accordingly, a conventional power saving circuit can be easily applied to a pre-call waiting state of a mobile phone, but is difficult to apply to a call waiting state requiring prompt return to a normal state. Thus, there is a limit in power saving.

SUMMARY OF THE INVENTION

The present invention is directed to implementation of a power control module capable of preventing unnecessary power consumption in a call waiting state as well as in an off state by controlling a power voltage (driving voltage) for a transceiving circuit in a mobile communication terminal.

The present invention is also directed to implementation of a power control module capable of enabling rapid return from a call waiting state that is a power saving mode to a busy operation state.

In other words, the present invention is directed to implementation of an object of supplying different voltages in an off state, a call waiting state, and a busy operation state, reducing current consumption in the off state and in the standby state, and time taken to reach the operation state from the standby state. In addition, the present invention is directed to implementation of an object of maximizing battery lifetime in a mobile communication terminal.

In order to achieve the objects, in the off state of the radio frequency transceiving circuit for the mobile communication terminal, the power source and the driving voltage are completely cut-off and power consumption is prevented and, in the call waiting state, a transistor turn-on voltage or less is applied, thereby minimizing consumption power and minimizing time taken to, when a signal is inputted, reach the busy operation state from the call waiting state, in comparison to when the power source reaches a turn-on state from a turn-off state.

One aspect of the present invention is to provide a driving voltage control module including: a regulator for converting an input power voltage into a predetermined level of DC voltage, and supplying the converted DC voltage to an external circuit module as a driving voltage; and a voltage controller for controlling an output voltage level of the regulator, wherein under control of the voltage controller, a level of the driving voltage is adjusted to be a standby voltage level lower than a turn-on voltage level of a switching device constituting the external circuit module. The standby voltage level is between a turn-on voltage and a ground voltage and is closer to the turn-on voltage.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Driving voltage, voltage applied as driving power source from the exterior to a predetermined IC device or its internal circuits, is generally applied, together with ground voltage, to a current channel of a transistor element constituting the internal circuit. The driving voltage also called power voltage is denoted by "VDD" in a device constituted of a MOS transistor, and is denoted by "VCC" in a device constituted of a bipolar transistor. In the following description, the driving voltage itself is denoted by "VDD", and a driving voltage level of a normal operation state is denoted by $V_{DD}$.

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

First Embodiment

Figure 1:
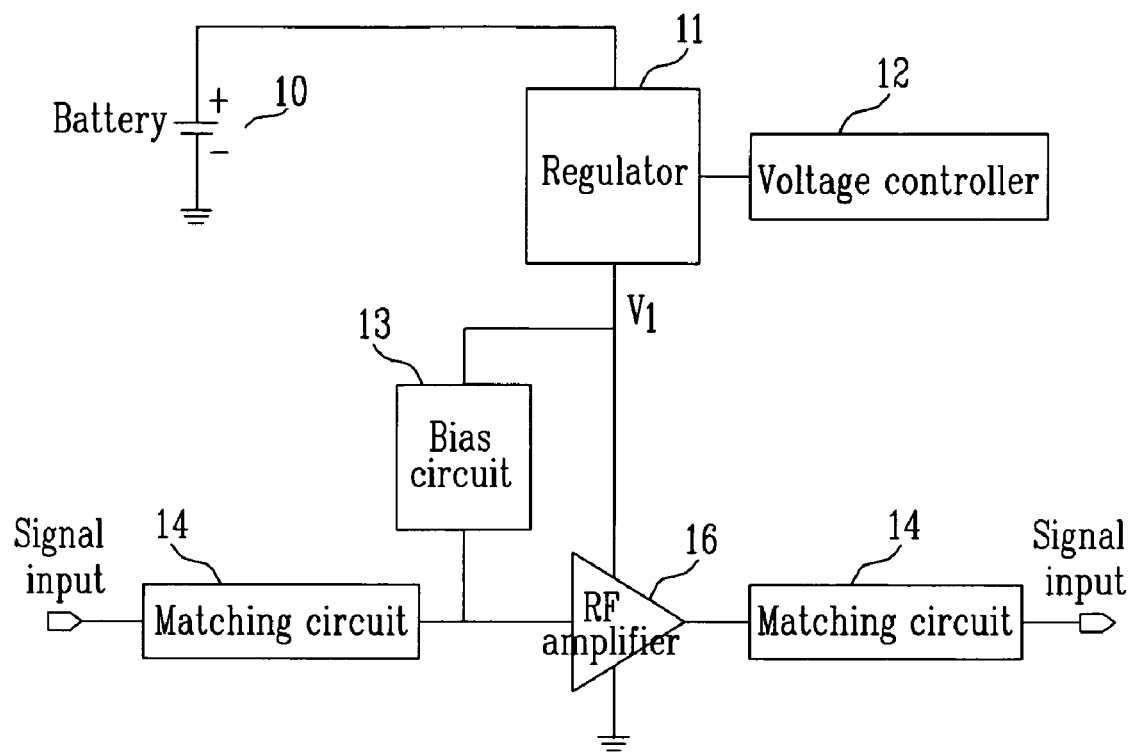
FIG. 1 is a block diagram illustrating a driving voltage control module applied to a radio frequency (RF) amplifier according to an embodiment of the present invention.

FIG. 1 illustrates a driving voltage control module applied to voltage control of a radio frequency (RF) amplifier of a mobile phone according to an embodiment of the present invention.

While a battery 10 is illustrated in FIG. 1 as a power source for a regulator 11, a direct current (DC) power voltage obtained by rectifying an alternating current (AC) power voltage, or a power voltage for a chip package may be used. The regulator 11 receives an external DC or AC power voltage and outputs a predetermined level of DC voltage. The regulator 11 may be any conventional regulator having a plurality of output voltage levels depending on an external control signal. The regulator 11 may have at least three output voltage levels, such as a normal state level, a cut-off level of 0V, and an intermediate level lower than a turn-on voltage of a switching device constituting a device. A voltage controller 12 may have a structure suitable for a type of the regulator 11. For example, when the output level of regulator 11 is determined by an analog level of an input control signal, the voltage controller 12 has a structure of outputting an analog signal having a suitable analog level depending on an external control guideline. On the other hand, when the output level of the regulator 11 is determined by a digital value of an input control signal, the voltage controller 12 has a structure of outputting a signal having a digital value that is determined depending on the external control guideline.

Figure 2:
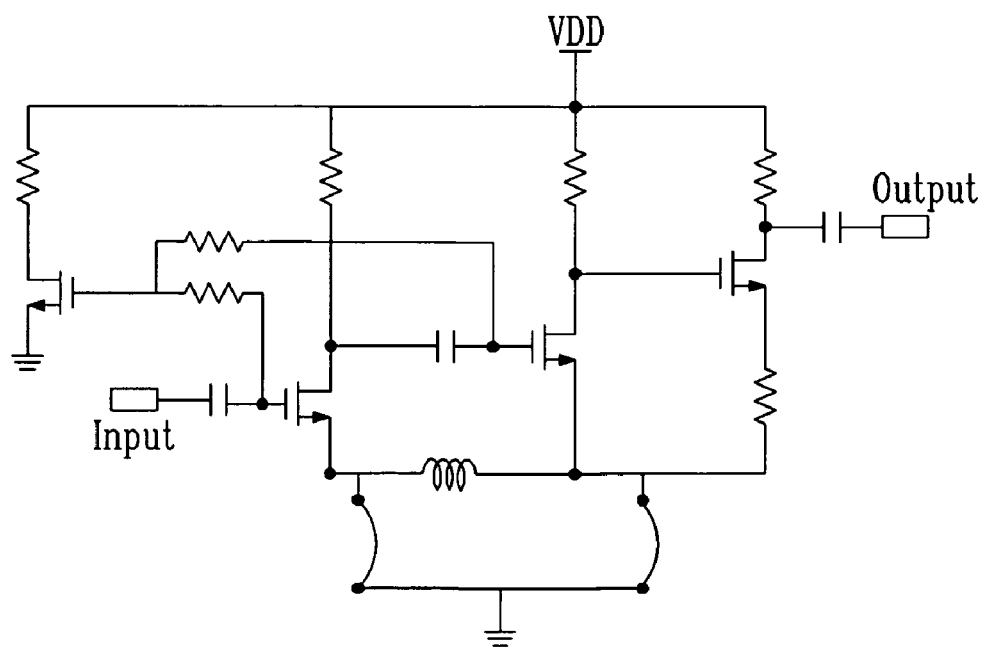
FIG. 2 is a circuit diagram illustrating an example of the block of FIG. 1, using a MOS transistor.

A bias circuit 13 and a matching circuit 14 can be additionally provided to the RF amplifier 16. FIG. 2 illustrates an amplification module including the matching circuit 14, the bias circuit 13, and the RF amplifier 16 of FIG. 1 according to an embodiment of the present invention. In the amplification module, the matching circuit is embodied by capacitors respectively located at input and output stages, the RF amplifier is embodied using three MOS transistors, and the bias circuit is embodied by one MOS transistor and a plurality of resistors.

A power voltage supplied from the battery 10 is converted into the power voltage ($V_{DD}$) necessary for normal operation of the RF amplifier 16 in a wireless terminal and supplied to the RF amplifier 16 through the regulator 11. The voltage controller 12 controls the output voltage of the regulator 11 to supply a voltage according to the cut-off state, the standby state, and the normal operation state. In other words, the voltage controller 12 supplies 0V in the cut-off state, a turn-on voltage ($V_{th}$) or less of a transistor in the standby state, and the $V_{DD}$ in the normal operation state.

The cut-off/standby/normal operation states of the RF amplifier 16 for amplifying a signal at a transmission side of a mobile communication terminal will be described by way of example. When the terminal is in a call waiting state, the RF amplifier 16 does not need to be suddenly activated. Therefore, the cut-off voltage of 0V is applied as the power voltage (VDD) for the RF amplifier 16, thereby preventing unnecessary power consumption. When the terminal is in a busy state but generate no signal to be transceived (that is, a transmitter state when a terminal user only listens, or a receiver state when the user speaks), it does not need to supply the power voltage to the RF amplifier 16 and consume power. However, as soon as the user speaks, the terminal should be able to return to the normal operation mode. In this case, in the present invention, the power voltage (VDD) of the RF amplifier is controlled to be a standby voltage of about 0.3V, thereby preventing unnecessary power consumption and guaranteeing fast activation of the RF amplifier.

Figure 8:
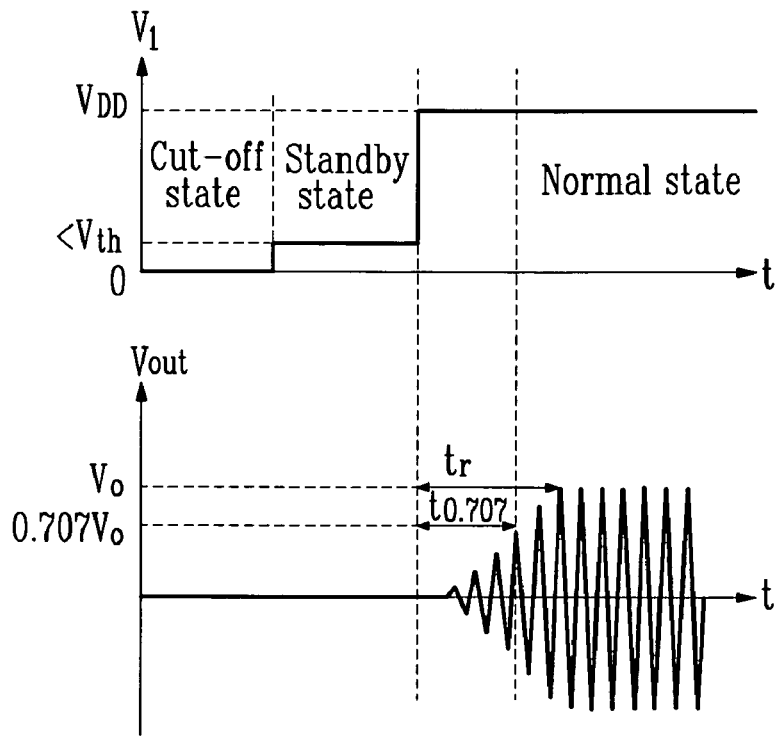
FIG. 8 is a graph illustrating a control voltage waveform of a driving voltage control module according to the present invention.

FIG. 8 illustrates a waveform of the output signal depending on the power voltage (VDD) level of the RF amplifier. It is assumed that the input signal continues to be applied as a predetermined sinusoidal wave. In actual implementation, when the cut-off voltage is necessary, a VDD stage itself is disconnected or the battery is disconnected. This is similar to a conventional art and thus a description thereof will be omitted. In the standby state, the standby voltage of about 0.3V is applied to the power voltage (VDD) stage of the RF amplifier 16. In this state, a MOS transistor constituting the RF amplifier 16 cannot be turned on, such that the power consumption is minimized and the output signal of the amplifier is substantially 0V. However, when RF amplification is required and thus the power voltage (VDD) of the RF amplifier 16 needs to be raised to the normal operation level ($V_{DD}$), time taken to raise the normal operation level ($V_{DD}$) is shortened by a time corresponding to 0.3V because the power voltage is 0.3 V, and turn-on time of the MOS transistor constituting the RF amplifier is also shortened by the time corresponding to 0.3V. Therefore, the output signal has a rapidly amplified waveform, thereby not affecting a phone call. It can be seen from FIG. 8 that a rising time ($t_r$) taken until the output signal is stabilized and a time ($t_{0.707}$) taken until the output signal falls into an allowed range are both short.

In this embodiment, the regulator 11 can be also embodied to supply three output levels of the cut-off voltage, the standby voltage, and the normal operation voltage to the power voltage of the RF amplifier 16 depending on an operation mode of the terminal. However, considering that, in a general mobile communication terminal, power voltages for all circuit modules necessary for phone call are cut off in the call waiting state, it is enough though the regulator 11 is embodied to supply two output levels of the standby voltage and the normal operation voltage as the power voltage of the RF amplifier 16.

Figure 3:
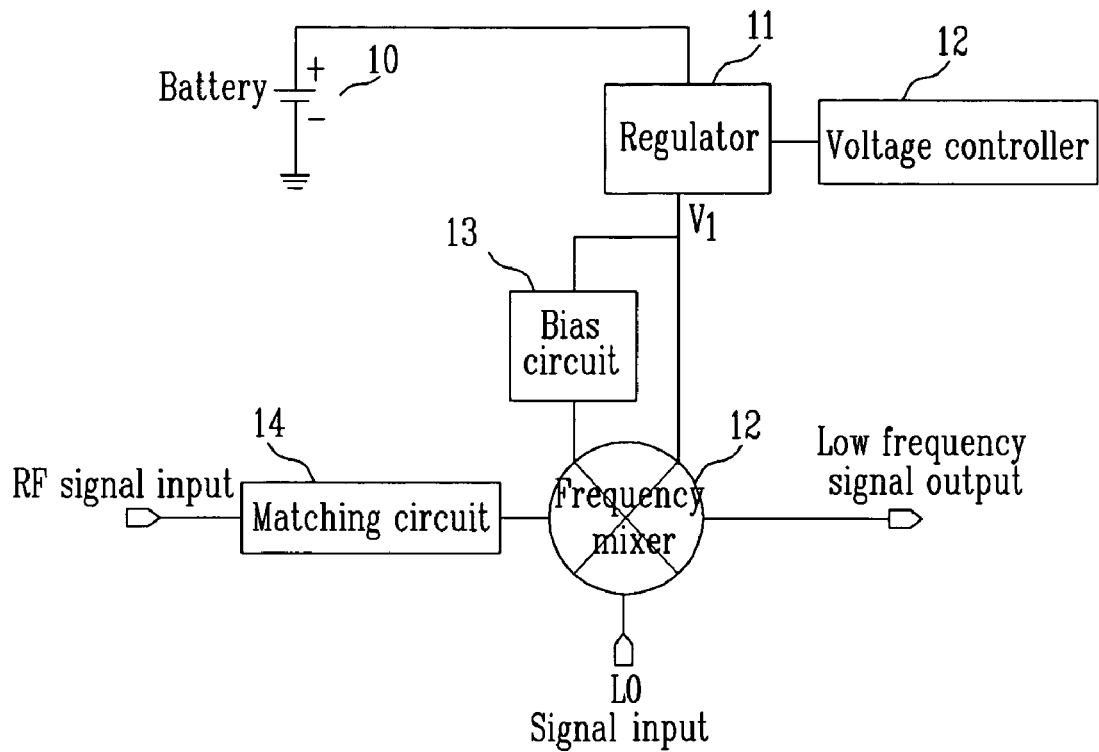
FIG. 3 is a block diagram illustrating a driving voltage control module applied to a frequency mixer according to another embodiment of the present invention.

FIG. 3 illustrates a driving voltage control module applied to voltage control of a frequency mixer 17 according to an embodiment of the present invention. Excepting that the RF amplifier is substituted with the frequency mixer 17, it is almost the same as FIG. 1 and therefore, its detailed description will be omitted.

Figure 4:
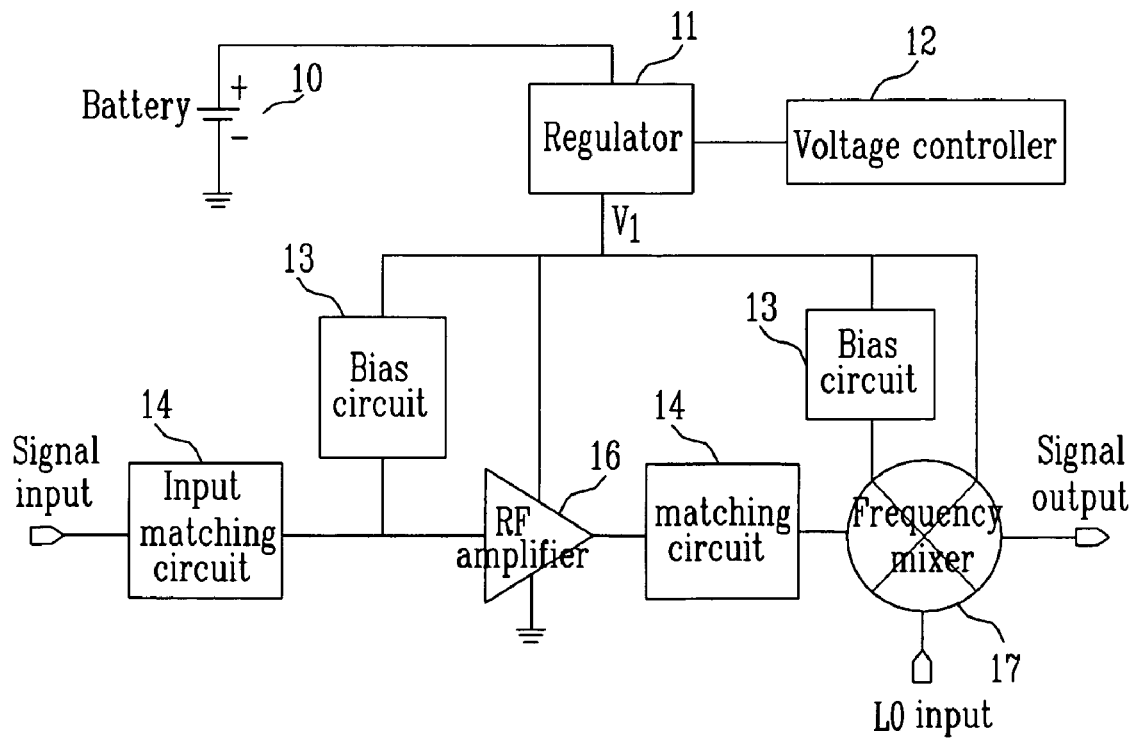
FIG. 4 is a block diagram illustrating a driving voltage control module applied to a radio frequency amplifier and a frequency mixer according to a further embodiment of the present invention.

FIG. 4 is a schematic diagram illustrating a voltage control method of the RF amplifier 16 and the frequency mixer 17 according to an embodiment of the present invention. One regulator 11 is used to concurrently supply a power voltage to the RF amplifier 16 and the frequency mixer 17. Operation and details of this structure can also be easily understood from the description of FIG. 1 and therefore, a detailed description thereof will be omitted.

Second Embodiment

This embodiment is to control a power voltage (VDD) for a circuit block within a mobile communication terminal according to the technical spirit of the present invention.

Figure 5:
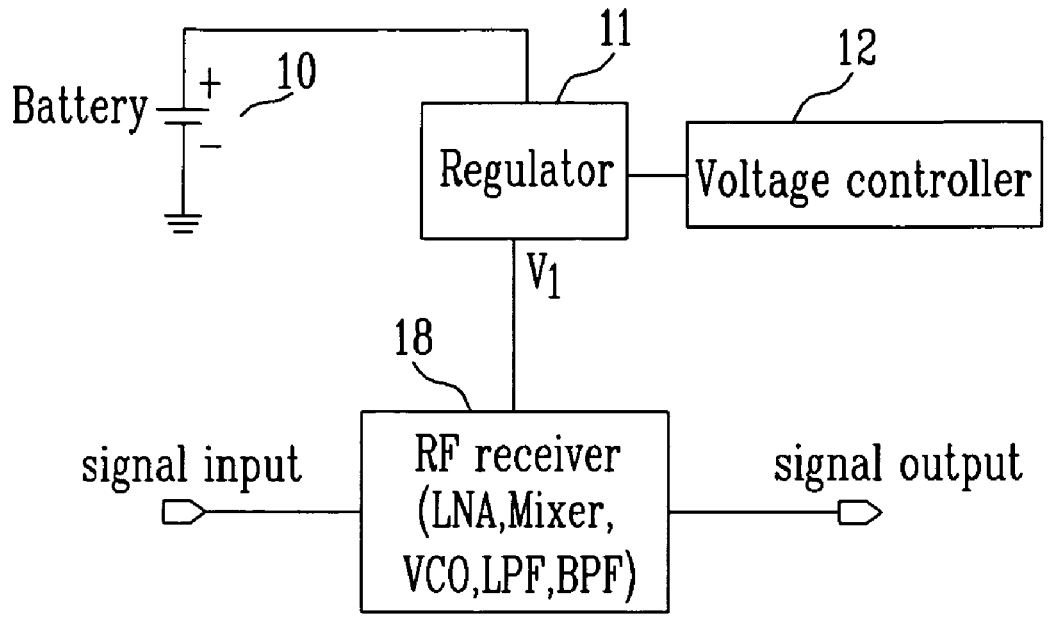
FIG. 5 is a block diagram illustrating a driving voltage control module applied to an RF receiving circuit block according to a further another embodiment of the present invention.
Figure 6:
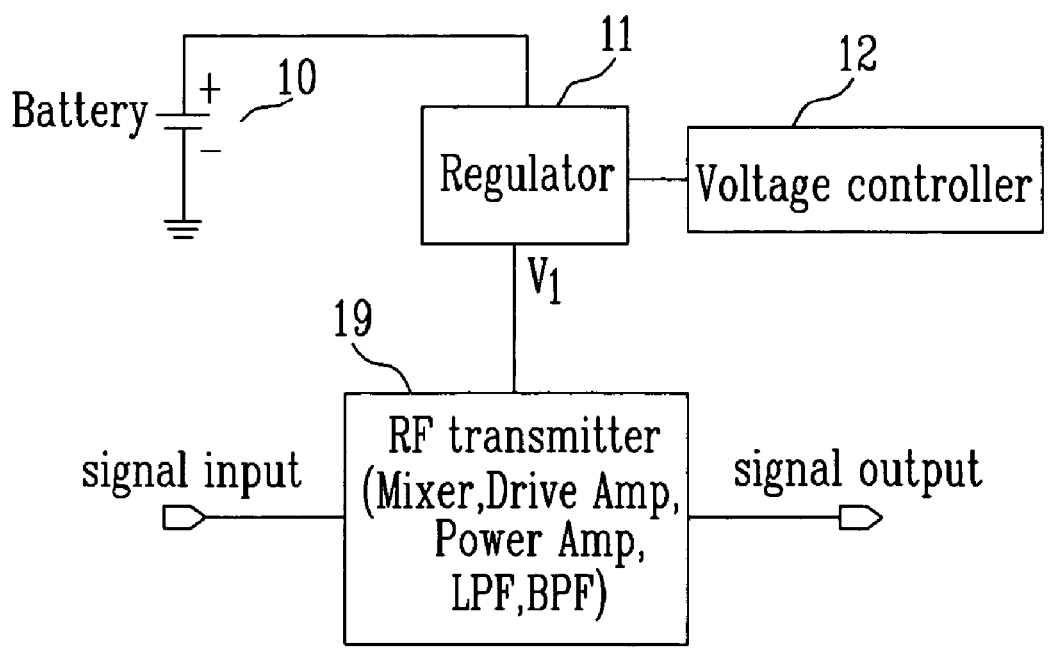
FIG. 6 is a block diagram illustrating a driving voltage control module applied to an RF transmitting circuit block according to a still another embodiment of the present invention.

FIGS. 5 and 6 are schematic diagrams illustrating a driving voltage control method of an RF receiving circuit block 18 or an RF transmitting circuit block 19 using a driving voltage control module according to the present invention. Each supplies power voltage, using one regulator 11, to a low noise amplifier (LNA), a frequency mixer (Mixer), a voltage control oscillator (VCO), a low pass filter (LPF), and a band pass filter (BPF), and to a frequency mixer (Mixer), a drive amplifier (Drive Amp), a low pass filter (LPF), and a band pass filter (BPF).

Figure 7:
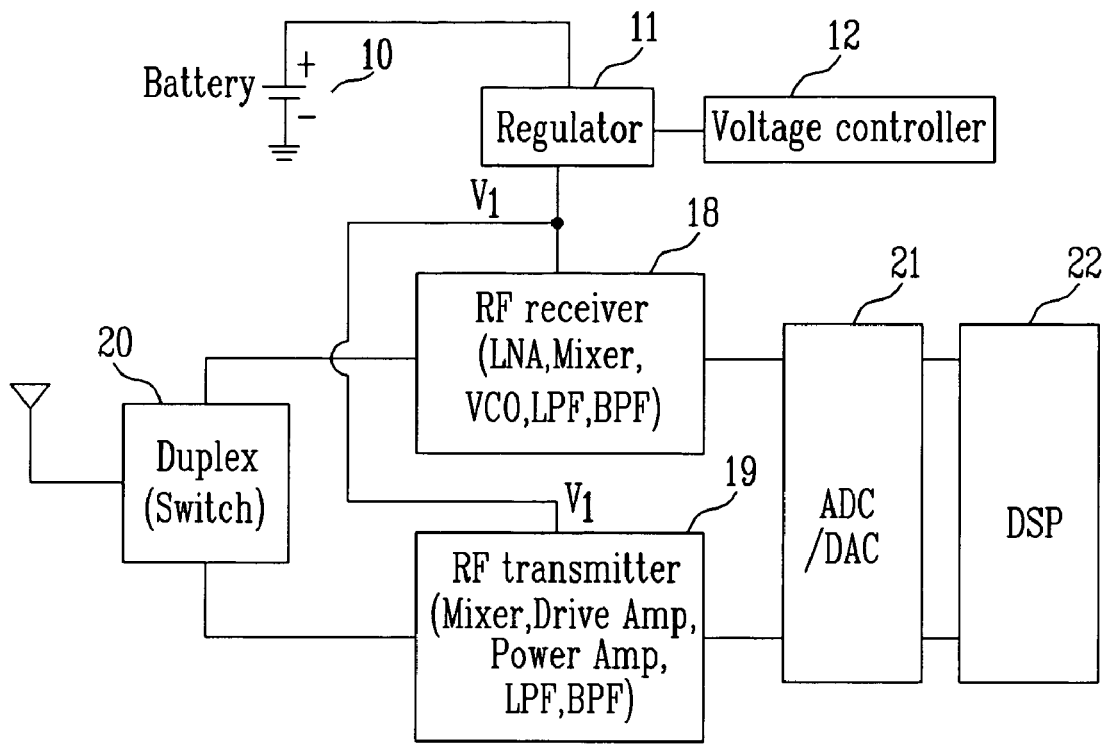
FIG. 7 is a block diagram illustrating a driving voltage control module applied to an RF receiving circuit block and an RF transmitting circuit block according to a yet another embodiment of the present invention.

FIG. 7 is a schematic diagram illustrating a driving voltage control method of an RF receiving circuit block 18 and an RF transmitting circuit block 19 using one driving voltage control module according to the present invention. One regulator 11 is used to concurrently supply a power voltage to the RF receiving circuit block 18 and the RF transmitting circuit block 19 using the driving voltage control module according to the present invention.

FIG. 8 is a graph illustrating a level variation of the power voltage (VDD) at each state by the voltage controller and a corresponding output voltage. This will be further described. In the cut-off state, a voltage ($V_1$) supplied to the regulator 11 as the power voltage (VDD) is 0V. In the standby state, the voltage ($V_1$) is the turn-on voltage ($0 \ll V_1 < V_{th}$) or less of the transistor. In the normal state, the voltage ($V_1$) is a predetermined positive (+) potential, VDD. The transistor refers to a transistor element constituting the RF amplifiers 16, the frequency mixers 17, the RF receiving circuit blocks 18, and the RF transmitting circuit blocks 19 of FIG. 1 and FIGS. 3 to 7 that receive the output voltage ($V_1$) of the regulator 11. The transistor is generally a MOS transistor.

Even though the supply voltage of the regulator 11 is changed from the standby state to the normal state, outputs ($V_{out}$) of the RF transceiver and amplifier and the frequency mixer do not immediately have normal outputs ($V_o$), and reach the normal state after lapse of a constant rising time ($t_r$). This is because time is taken to raise a gate voltage for turning on of the transistor constituting the RF amplifier, that is, the MOS transistor having a gate capacitance component.

If the supply power voltage of the regulator 11 is cut off as 0V in a call waiting state of a mobile phone, the rising time gets much longer and the response speed gets slower, thereby deteriorating a quality of phone call. On contrary, if a voltage such as $V_{DD}$ of FIG. 8 is always supplied without cut-off of the supply power voltage from the regulator 11 in the call waiting state, the RF transceivers and the circuits are always turned on, thereby increasing the current consumption. Therefore, battery lifetime is shortened.

In this manner, in the call waiting state, the driving voltage control module according to the present invention adjusts the power voltage supplied from the regulator to be the turn-on voltage or less of the transistor and, more specifically, a level closer to the turn-on voltage level between the ground voltage level and the turn-on voltage level, thereby reducing the current consumption and reducing the time taken to reach the normal state from the standby state.

With the driving voltage control module according to the present invention, the transceiving circuit and the RF circuit of the RF mobile communication terminal can be supplied with distinct power voltages each corresponding to the cut-off state, the standby state, and the normal operation state, thereby reducing current consumption and the time taken to reach the normal state from the standby state.

This can increase the battery lifetime and embody a high-speed RF mobile communication terminal.

While the invention has been shown and described with reference to certain exemplary embodiments thereof, it will be understood by those skilled in the art that various changes in form and details may be made therein without departing from the spirit and scope of the invention as defined by the appended claims.

While the case including the transistor element having a positive (+) turn-on voltage has been described by way of example in order to avoid repeated description, it can be easily appreciated by those skilled in the art that suitable modification may be made to the present invention without departing from the scope of the present invention in order to apply the present invention to the case including a transistor element having a negative (−) turn-on voltage.

While the RF amplifier and mixer has been described as examples of the external circuit module, the external circuit module can be at least one of RF and analog circuits in a wireless communication system, such as RF amplifier, mixer, VCO, VGA or filters. And suitable modification of that may be made to the present invention without departing from the scope of the present invention.

What is claimed is:

1. A driving voltage control module comprising:
   a regulator for converting an input power voltage into a predetermined level of DC voltage and supplying the converted DC voltage to an external circuit module as a driving voltage; and
   a voltage controller for controlling an output voltage level of the regulator, wherein, under control of the voltage controller, a level of the driving voltage is adjusted to be a standby voltage level lower than a turn-on voltage level of a switching device constituting the external circuit module,
   wherein the level of the driving voltage to go from the standby voltage level to the turn-on voltage level of the switching device is configured to reduce current consumption, and
   wherein a time for the level of the driving voltage to go from the standby voltage level to the turn-on voltage level of the switching device is configured to be reduced.

2. The module according to claim 1, wherein the voltage controller controls the output voltage level of the regulator to be one of a driving voltage level of a normal state circuit module, a cut-off level of 0V, and the standby voltage level.

3. The module according to claim 1, wherein the voltage controller controls the output voltage level of the regulator to be one of a driving voltage level of a normal state circuit module and the standby voltage level.

4. The module according to claim 1, wherein the standby voltage level is between a ground voltage level and the turn-on voltage level and is closer to the turn-on voltage level.

5. The module according to claim 1, wherein the external circuit module includes at least one of RF and analog circuits in a wireless communication system, and a RF receiving block or a RF transmitting block of a mobile communication terminal.

* * * * *